United States Patent [19]

Schuhmacher et al.

[11] Patent Number: 5,421,978
[45] Date of Patent: Jun. 6, 1995

[54] TARGET COOLING SYSTEM WITH TROUGH

[75] Inventors: Manfred Schuhmacher, Alzenau; Helmut Schilling, Rodenbach; Gerhard Joos, Grossostheim, all of Germany

[73] Assignee: Leybold Aktiengesellschaft, Hanau, Germany

[21] Appl. No.: 174,149

[22] Filed: Dec. 28, 1993

[30] Foreign Application Priority Data

Jan. 21, 1993 [DE] Germany ............ 43 01 516.6

[51] Int. Cl.$^6$ .......................................... C23C 14/34
[52] U.S. Cl. ........................... 204/298.09; 204/298.12; 204/298.19
[58] Field of Search .................. 204/298.09, 298.12, 204/298.19

[56] References Cited

U.S. PATENT DOCUMENTS

| | | |
|---|---|---|
| 4,826,584 | 5/1989 | dos Santos Pereiro Ribeiro ............... 204/298.09 |
| 5,039,913 | 8/1991 | Wegmann et al. ............... 315/112 |
| 5,071,535 | 12/1991 | Hartig et al. ............... 204/298.09 |
| 5,203,980 | 4/1993 | Cremer et al. ............... 204/298.08 |
| 5,259,941 | 11/1993 | Münz ............... 204/298.09 |
| 5,269,894 | 12/1993 | Kerschbaumer ............... 204/192.12 |

FOREIGN PATENT DOCUMENTS

| | | | |
|---|---|---|---|
| 242826 | 4/1987 | European Pat. Off. ........ | 204/298.09 |
| 482541 | 4/1992 | European Pat. Off. ........ | 204/298.08 |
| 512456 | 11/1992 | European Pat. Off. ........ | 204/298.12 |
| 3810175 | 10/1989 | Germany ............... | 204/298.09 |
| 9102052 | 7/1991 | Germany ............... | 204/298.09 |
| 4015388 | 11/1991 | Germany ............... | 204/298.09 |
| 63-35770 | 2/1988 | Japan ............... | 204/298.09 |
| 672319 | 11/1989 | Switzerland ............ | 204/298.09 |
| 699032 | 12/1979 | U.S.S.R. ............ | 204/298.12 |
| 823459 | 4/1981 | U.S.S.R. ............ | 204/298.09 |

OTHER PUBLICATIONS

Lake, M. R., Harding, G. L. Cathode Cooling Apparatus for a Planar Magnetron . . . , J. VAc. Sci. Technol. A2(3), Jul. Sep. 1984, pp. 1391–1393.
Rastogi et al., Simple Planar Magnetron Sputtering Source., Rev. Sci. Instrum. 58(8) Aug. 1987 pp. 1505–1506.

Primary Examiner—Aaron Weisstuch
Attorney, Agent, or Firm—Felfe & Lynch

[57] ABSTRACT

Cathode sputtering apparatus includes a target, a cooling channel, and a flexible diaphragm therebetween. The target is fixed to a base independently of the diaphragm, so that the target can be replaced with disturbing the cooling channel. In a preferred embodiment, the diaphragm and the target are fixed by respective sets of cleats retained by screws received from respective opposite directions.

14 Claims, 2 Drawing Sheets

TARGET COOLING SYSTEM WITH TROUGH

BACKGROUND OF THE INVENTION

The invention relates to a target-and-cathode arrangement for a cathode sputtering apparatus having a continuous form of cathode with a target body which can be coupled to a cooling system by means of a releasable fastening device.

In production plants for the preparation of substrates that are to be coated, a routine changing of the targets is necessary on account of the constant bombardment of the target bodies with ions and the resultant sputtering of the target bodies. The down time necessitated thereby has to be kept as brief as possible from the viewpoint of the economic utilization of such machines. However the target changing is often complicated by the fact that the target bodies are in direct contact with a cooling system. When targets are replaced, the cooling system usually has to be opened up, which necessitates tedious cleaning operations.

The cooling of a target body is necessitated by its being constantly bombarded with ions, which exposes the target body to great thermal stress. As a precaution against embrittlement and overheating of the target material, provision must be made for an especially good heat transfer between target body and cooling system. This is usually accomplished by putting the entire surface of the bottom of the target body in contact with a cooling surface whose bottom in turn is in contact with a cooling liquid.

Known cooling systems have a plate between the cooling system and the target body, but when the target is replaced the plate also has to be raised so that the cooling channel will be open, and it calls for the replacement or cleaning of any gaskets that may be present. Changing the target bodies thus simultaneously requires intervention in the cooling system, which calls for an enormous additional amount of work. Furthermore, when reassembling the risk of leakage in the cooling system is very great, so that a water-tightness and vacuum-tightness test must be performed in order to assure trouble-free continued operation.

It is not only the opening of cooling systems that is involved in the replacement of targets in known cathode sputtering apparatus, but depending on the structural characteristics, the magnet systems of the apparatus are also exposed to external mechanical influences. Accidental maladjustment or damage to the magnets can adversely affect the stability of the plasma.

SUMMARY OF THE INVENTION

The invention is addressed to a cathode sputtering apparatus having a continuous sealed channel cathode configuration with a target body that can be coupled to a cooling system by means of a releasable fastening device, so that the replacement of a target body can be performed very quickly and so that the cooling system will remain unaffected thereby. Intensive contact between the cooling system and the target body produces an optimum cooling, so that the rate of ablation of the target material can be optimized. Furthermore, the magnets provided for the stabilization of the plasma are mounted beneath the cooling system, well protected against mechanical damage during target replacement, and do not come in contact with the cooling system.

According to the invention, a separating diaphragm is provided which is in contact on the one hand with the cooling system and on the other hand with the target body by means of separate fastening devices.

The diaphragm is preferably a discrete metal plate which is flexible in order to maintain contact with the target at all times.

The idea of the invention will be described with the aid of a special embodiment, the so-called "HLK-Kathode" (high-power cathode). Likewise, the invention can also be applied to so-called "interpole targets."

High-power target arrangements are characterized by the fact that two trains of target bodies run substantially parallel side by side and are spaced apart; two semicircular target sections connect the parallel trains to one another.

The dividing diaphragm is integrally mounted under the target body array such that it is in contact with the entire bottom of the target bodies. It is important that the fastening of the dividing diaphragm to the cooling body, which is preferably configured as a trough, is joined to the cooling body at its margin by screw fasteners. The target bodies are joined to the cooling system separately therefrom, so that they can be removed separately.

DETAILED DESCRIPTION OF THE PREFERRED EMBODIMENT

Figure 1:
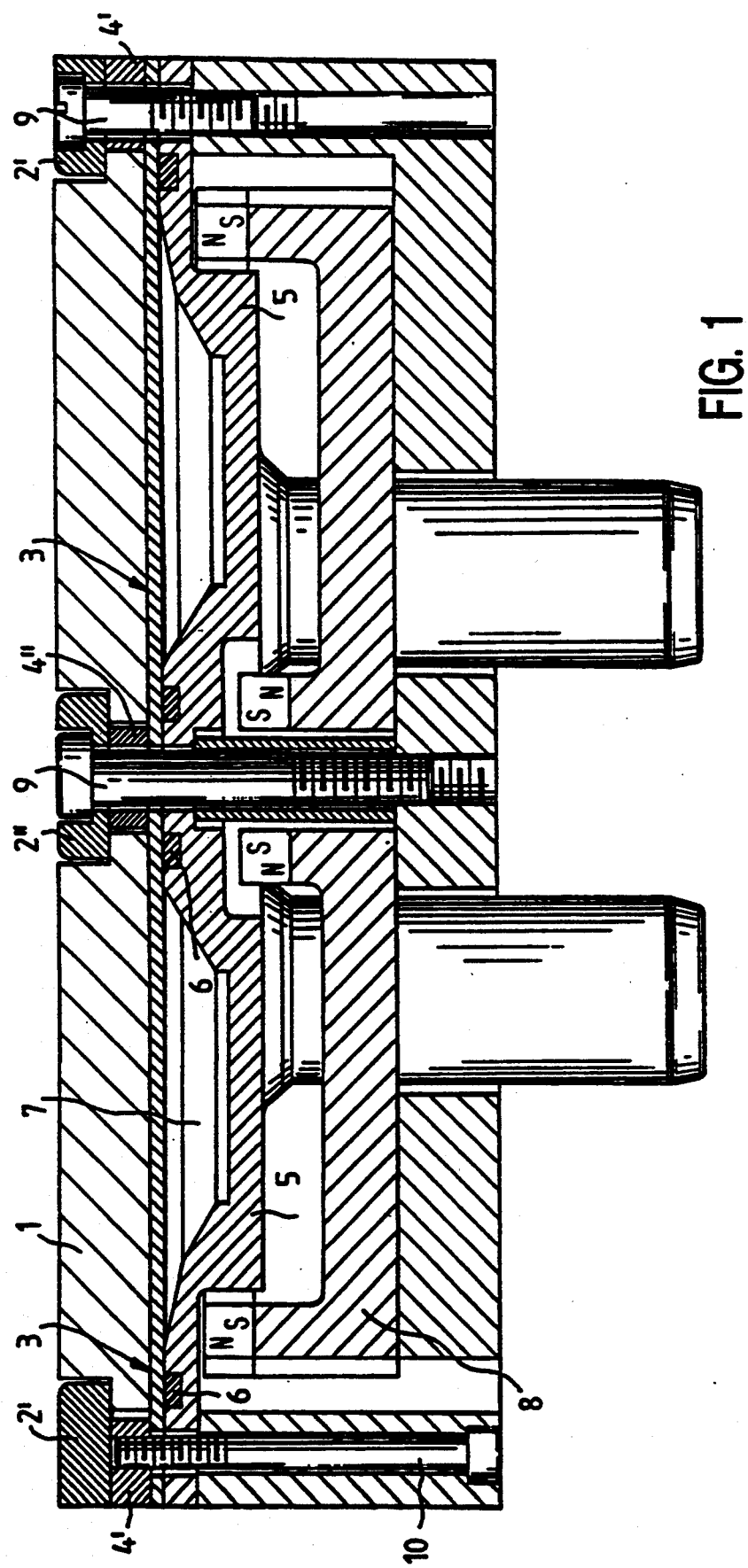
FIG. 1 shows a cross section through the target.

FIG. 1 shows a cross section through a high-power target which has two elongate target bodies 1 arranged parallel to one another. The flat-shaped target bodies 1 are affixed to the target holder 20 by outer cleats 2' and first inner cleats 2. The cleats 2 and 2' are removably affixed to the rest of the target holder 20 by downwardly inserted screws 9, so that loosening the fastening screws 9 permits the removal of cleats 2 and 2'. The target bodies 1 are fastened by the cleats 2 and 2' such that the lateral sections of the cleats lie on stepped lateral projections of the target bodies and by the pressure of the screws produce a downwardly directed force on them.

Figure 2:
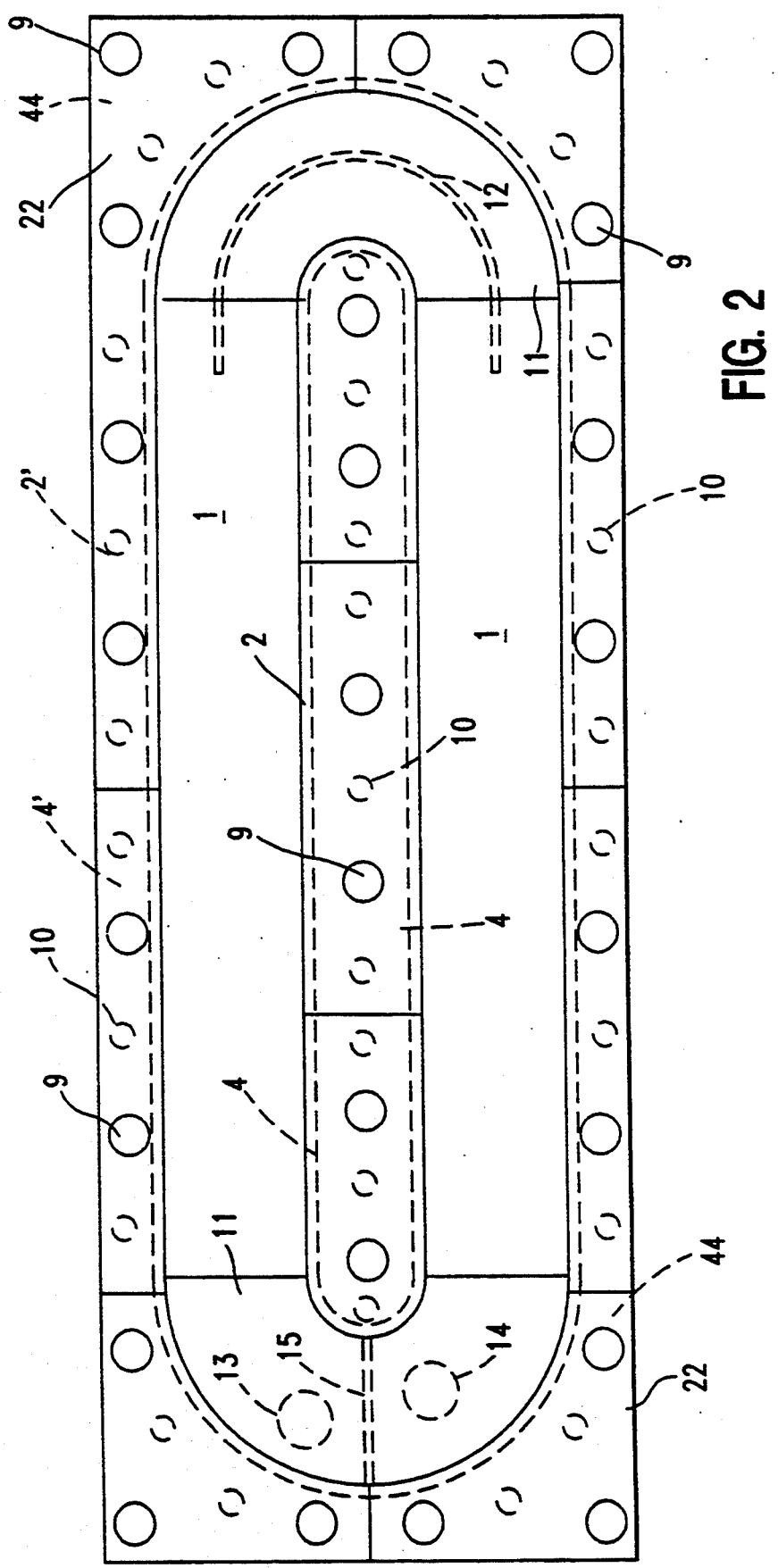
FIG. 2 shows a plan view of the target.

In addition to the elongate target-bodies 1, semicircular target end bodies 11 retained by end cleats 22 are used to form a complete racet-rack as shown in FIG. 2. Round target bodies can also be used, which can be affixed to the dividing diaphragm by means of a central hollow screw.

The entire bottom surfaces of the target bodies 1 and 11 lie on a separating diaphragm 3 without being in non-displaceable contact with it, i.e., the dividing diaphragm 3 can shift relative to the target bodies 1 within a certain range due to thermal expansion.

The dividing diaphragm 3 extends in one piece over the entire surface underneath the target bodies 1 and 11 of the system. Screws 9 pass through holes in the diaphragm for fastening the cleats 2 in the center and 2' at the marginal areas. The thickness of the dividing diaphragm 3 is advantageously made such that the inherent flexibility of the dividing diaphragm permits all thermal expansion of the target body and is always in direct contact with the bottom of the target bodies 1 and 11.

The dividing diaphragm 3 is affixed at the left and right side of the base 20 by outer cleats 4', and at the center by inner cleats 4. End cleats 44 are provided underneath the end cleats 22 of FIG. 2.

According to the invention, the cleats 2, 2', 22 for fastening the target body 1 and the cleats 4, 4', 44 for mounting the diaphragm 3 are separate from one another. Thus, in the embodiment shown in FIG. 1, the cleats 4, 4' are drawn from below by means of long screws 10, so that the dividing diaphragm 3 is compressed between the cleats 4, 4' and the trough 5. Holes in the diaphragm for receiving screws 9 and 10 therethrough are oversized to permit shifting relative to the target bodies due to thermal expansion.

By the fastening measures described, the dividing diaphragm is clamped downwardly against a trough 5, which has in its marginal area gaskets 6 which prevent the escape of cooling fluid from the channel 7 formed by the trough 5. The cooling channel 7 is configured such that the greatest possible part of the bottom of the dividing diaphragm is in contact with cooling fluid. Note that the outer portion of each channel 7 is wider and shallower than the corresponding inner portion.

The magnet system 8 is mounted underneath the trough body 5 such that the magnet poles are covered by the trough body. Any direct contact of the magnets with the cooling fluid is completely prevented by this arrangement.

Replacement of the target bodies therefore requires only the loosening of the screws 9 inserted downwardly at the marginal areas of the cleats 4', but they release only the cleats 2'. By loosening or removing the screws 9 of the cleats 2, 2', the target bodies 1 can be removed from the apparatus without thereby releasing the dividing diaphragm 3, which is affixed to the trough body 7 by screws 10 and cleats 4, 4' and 44. The insertion of a new target body 1 is then performed in reverse order.

The separation of the target body fastening means from the dividing diaphragm fastening means makes possible a quicker and cleaner target replacement, which is desirable especially in operations in production plants. The problem of possible leakages in the cooling circuit is eliminated with this arrangement.

Another advantage has to do with the arrangement of the magnets. Since in the embodiment described the magnets do not come in contact with the coolant contained in the cooling channel 7, they are also exempt from the danger of corrosion. Also, they are protected by the trough from mechanical damage during replacement of the target bodies.

Referring to FIG. 2, the cooling channel 7 of the high-power target arrangement has at one end an inlet 13 and an outlet 14 separated by a barrier 15. At the opposite end the cooling liquid is forced by the centrifugal force into the outer part of the curve, so that it could happen that there is not enough cooling fluid in the inner part of the curves. For this reason a flow plate 12 is provided passing through the cooling channel in the flow direction. This assures that the bottom of the dividing diaphragm is wetted by the cooling fluid and provides for optimal cooling of the target body.

By providing the dividing diaphragm between the cooling circuit and the target body in thermal contact therewith it is possible when target bodies are replaced to avoid any tedious down periods and also to leave the cooling circuit unaffected thereby. By these measures the reliability of the operation of cathode sputtering apparatus is considerably improved and made more economical.

We claim:

1. Cathode sputtering apparatus comprising
   a target,
   a base,
   a trough defining a cooling channel between said target and said base,
   a diaphragm in the form of a discrete, flat metal plate between said trough and said target, said diaphragm contacting both said target and said cooling channel,
   means for fixing said diaphragm to said base in order to close said cooling channel,
   means for fixing said target to said base independently of said means for fixing said diaphragm to said base, whereby,
   said target may be removed from said apparatus without opening said cooling channel.

2. Apparatus as in claim 1 wherein said means for fixing said diaphragm to said base comprises first cleat means fixed to said base by first screw means passing through said diaphragm.

3. Apparatus as in claim 2 wherein said first cleat means has threaded bore means which receives said first screw means, said base having bore means which receives said screw means therethrough.

4. Apparatus as in claim 2 wherein said means for fixing said target to said base comprises second cleat means fixed to said base by second screw means passing through said first cleat means and said diaphragm.

5. Apparatus as in claim 4 wherein said diaphragm has holes to receive said first and second screw means therethrough, said holes being oversized relative to said screw means in order to accommodate thermal expansion of said diaphragm.

6. Apparatus as in claim 1 wherein said trough has marginal portions fixed between said diaphragm and said base.

7. Apparatus as in claim 6 wherein said diaphragm completely covers said trough.

8. Apparatus as in claim 7 wherein said diaphragm is a flexible plate.

9. Apparatus as in claim 6 further comprising magnet means located opposite said marginal portions from said target.

10. Apparatus as in claim 1 wherein said target is a loop-like target having an inner periphery and an outer periphery.

11. Apparatus as in claim 10 wherein said means for fixing said diaphragm to said base comprises first cleat means inside said inner periphery and outside said outer periphery, said means for fixing said target to said base comprising second cleat means over said first cleat means and overlapping said inner periphery and said outer periphery.

12. Apparatus as in claim 10 wherein said trough defining said cooling channel comprises a loop-like trough pressed against said diaphragm opposite said target, said trough having curved sections.

13. Apparatus as in claim 12 wherein said curved sections are shallower toward said outer periphery than toward said inner periphery.

14. Apparatus as in claim 12 wherein said trough defining said cooling channel further comprises inlet means, outlet means, and a barrier therebetween, thereby causing coolant to flow in a circuit, one of said curved sections having a flow plate which causes said coolant to flow in an outer stream toward said outer periphery and an inner stream toward said inner periphery.

* * * * *